(12) United States Patent
Henrion et al.

(10) Patent No.: US 6,307,437 B1
(45) Date of Patent: Oct. 23, 2001

(54) MOS LOAD, POLE COMPENSATION

(75) Inventors: W. S. Henrion; Phillip Kruczkowski, both of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/540,107

(22) Filed: Mar. 31, 2000

(51) Int. Cl.[7] ....................................... H03F 1/14
(52) U.S. Cl. ............................................... 330/292
(58) Field of Search ................... 330/292, 300, 330/305, 307

(56) References Cited

U.S. PATENT DOCUMENTS 5,392,000 * 2/1995 Gillig ................................... 330/107
5,420,542 * 5/1995 Harvey ................................ 330/292

* cited by examiner

Primary Examiner—Steven J. Mottola
(74) Attorney, Agent, or Firm—Christopher P. Maiorana, P.C.

(57) ABSTRACT

An apparatus comprising an analog circuit, a passive circuit and a first circuit. The analog circuit may be configured to vary a voltage of an output signal in response to a first signal. The passive circuit may be configured to further vary the voltage. The first circuit may be configured to further vary the voltage. The first circuit generally comprises a parasitic capacitance. The passive circuit and the first circuit are generally coupled in series.

15 Claims, 2 Drawing Sheets

MOS LOAD, POLE COMPENSATION

FIELD OF THE INVENTION

The present invention relates to active loads in linear analog circuits generally and, more particularly, to pole spreading of active loads in linear analog circuits.

BACKGROUND OF THE INVENTION

Conventional linear analog circuits, such as two stage amplifiers, implement an active load stage. Conventional active load stages have (i) large DC and low frequency gains and (ii) a dominant pole resulting from a high output impedance and large parasitic capacitance at a respective output node. The gain of conventional amplifiers will remain above one at a frequency when the combined phase shift of the inverting amplifier, a dominant pole and the higher order poles equal 360 degrees. Conventional amplifiers require an additional capacitance at the dominant pole node to shift the dominant pole to an even lower frequency causing the gain to be below one when the total phase shift equals 360 degrees.

Conventional amplifiers implement an additional resistor to increase the phase margin of the amplifier by placing a zero on the next higher order pole. The resistor can be added in series with the capacitor to create a zero at the next higher order pole. However, a parasitic capacitance at the output node will eventually create another pole. The additional pole will cause the phase shift to again approach 360 degrees before the loop gain drops below one. The parasitic capacitance limits gain bandwidth (GBW) of conventional amplifiers.

Active loads are common in conventional amplifiers. The active loads are common because of (i) large dynamic output impedances for relatively high currents and (ii) simplistic conventional architecture. Active loads at high frequencies have large parasitic capacitances which can negate gain advantages of the high dynamic impedance of the active load at low frequencies. Conventional amplifiers may cause a dominant pole to be generated at $1/[(2\pi Ro)(Cdw+Cpar)]$, where Cdw is a drain to well capacitance, Cpar is a parasitic capacitance and Ro is a dynamic output resistance of the active load in parallel with the impedance of an output transistor. The dominant pole is required to be shifted to a lower frequency. The dominant pole is required to be shifted so the gain will fall below one before the total phase shift exceeds 360 degrees.

It is desirable to implement a method and/or architecture that may present an open loop gain that is less than one at a frequency lower that the frequency at which the total phase shift exceeds 360 degrees.

SUMMARY OF THE INVENTION

The present invention concerns an apparatus comprising an analog circuit, a passive circuit and a first circuit. The analog circuit may be configured to vary a voltage of an output signal in response to a first signal. The passive circuit may be configured to further vary the voltage. The first circuit may be configured to further vary the voltage. The first circuit generally comprises a parasitic capacitance. The passive circuit and the first circuit are generally coupled in series.

The objects, features and advantages of the present invention include providing a method and/or architecture that may (i) eliminate (or reduce) the effect of the drain to well capacitance, (ii) provide an increased gain bandwidth, (iii) reduce a size of a compensation capacitor and/or (iv) prevent a parasitic capacitance of a load from creating an additional pole at a node.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
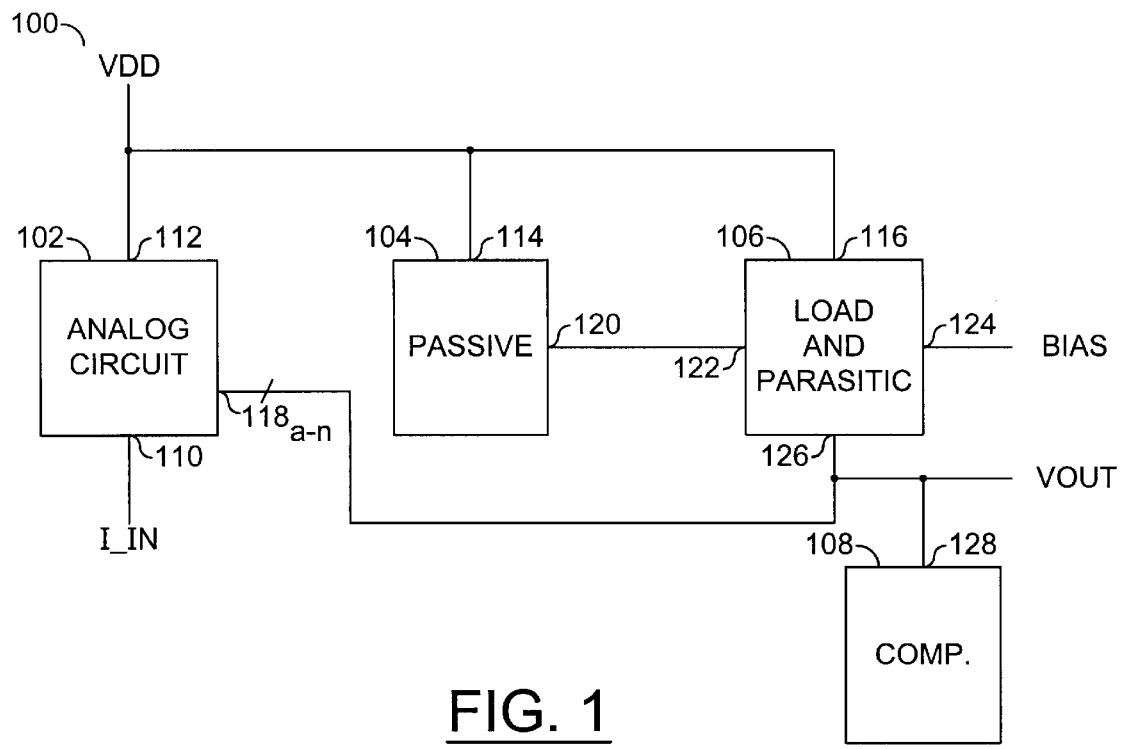
FIG. 1 is a block diagram of a preferred embodiment of the present invention.

Referring to FIG. 1, a block diagram of circuit 100 is shown in accordance with a preferred embodiment of the present invention. The circuit 100 may provide a limited open loop gain that is generally less than one at a frequency prior to a phase shift that may exceed or be equal to 360 degrees. The circuit 100 may implement the limited open loop gain to provide an operation that may be unconditionally stable. The circuit 100 may implement pole spreading in order to provide the limited open loop gain. In one example, the circuit 100 may be implemented as an amplifier circuit. In another example, the circuit 100 may be implemented as an amplifier with an active load in an isolated well at a node where a dominant pole is created.

The structure of the circuit 100 generally comprises an analog block (or circuit) 102, a passive block (or circuit) 104, a load and parasitic block (or circuit) 106, and a compensation block (or circuit) 108. The analog circuit 102 may receive a signal (e.g., I_IN) at an input 110 and a power source (e.g., VDD) at an input 112. In another example, the power source VDD may be implemented as an independent voltage source. The signal I_IN may be implemented, in one example, as an input current. The power source VDD may additionally be presented to (i) an input 114 of the passive circuit 104 and (ii) an input 116 of the load and parasitic circuit 106. The analog block 102 may have a number of input/outputs 118a–118n (shown in more detail in connection with FIG. 2) connected to an output signal (e.g., VOUT). The signal VOUT may be implemented as an output voltage, an output node voltage or any other appropriate signal or node voltage in order to meet the criteria of a particular implementation.

A bias voltage (e.g., BIAS) may be presented to an input 124 of the load and parasitic circuit 106. The bias voltage BIAS may be implemented at an appropriate level in order to meet the criteria of a particular implementation. The load and parasitic block 104 may have an input/output 122 that may be connected to an input/output 120 of the passive block 104. An output 126 of the load and parasitic block 106 may be connected to the output node VOUT. An input/output 128 of the compensation block 108 may be connected to the output node VOUT.

Figure 2:
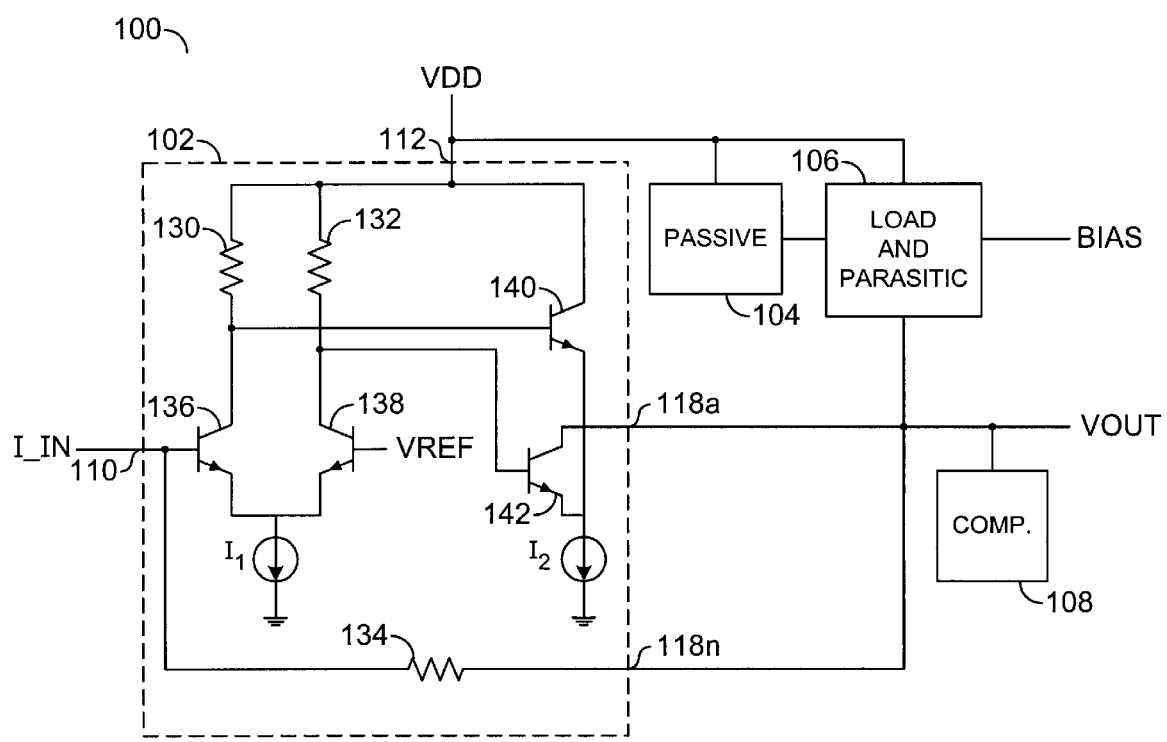
FIG. 2 is a schematic of an analog circuit of FIG. 1.

Referring to FIG. 2, a detailed schematic of the analog circuit 102 is shown. The structure of the analog circuit 102 may comprise a resistor 130, a resistor 132, a feedback resistor 134, a transistor 136, a transistor 138, a transistor 140 and a transistor 142. The power supply VDD may be presented to the input 112 of the analog circuit 102. The current I_IN may be additionally presented to the input 110 of the logic block 102.

The power supply VDD may be presented to a first side of the resistor 130, a first side of the resistor 132 and a collector of the transistor 140. The current I_IN may be presented to a base of the transistor 136 and to a first side of the feedback resistor 134. The current I_IN may control the transistor 136. A second side of the resistor 134 may be connected to the output node VOUT.

A second side of the resistor 130 may be connected to a collector of the transistor 136. The second side of the resistor 130 may additionally be presented to a base of the transistor 140. The transistor 136 may control the transistor 140 (e.g., when the transistor 136 transitions high, the transistor 140 may also transition high). A second side of the resistor 132 may be connected to a collector of the transistor 138. A base of the transistor 138 may receive a voltage (e.g., VREF). In one example, the voltage VREF may be implemented as 1.2V. However, the voltage VREF may be implemented as a reference voltage or other appropriate level voltage in order to meet the criteria of a particular implementation. The voltage VREF may control (e.g., turn on or off) the transistor 138. The second side of the resistor 132 may additionally be presented to a base of the transistor 142. The transistor 138 may control the transistor 142. An emitter of the transistor 136 and an emitter of the transistor 138 may be connected to a current source (e.g., I1). An emitter of the transistor 146 and a drain of the transistor 142 may be connected to a current source (e.g., I2).

Figure 3:
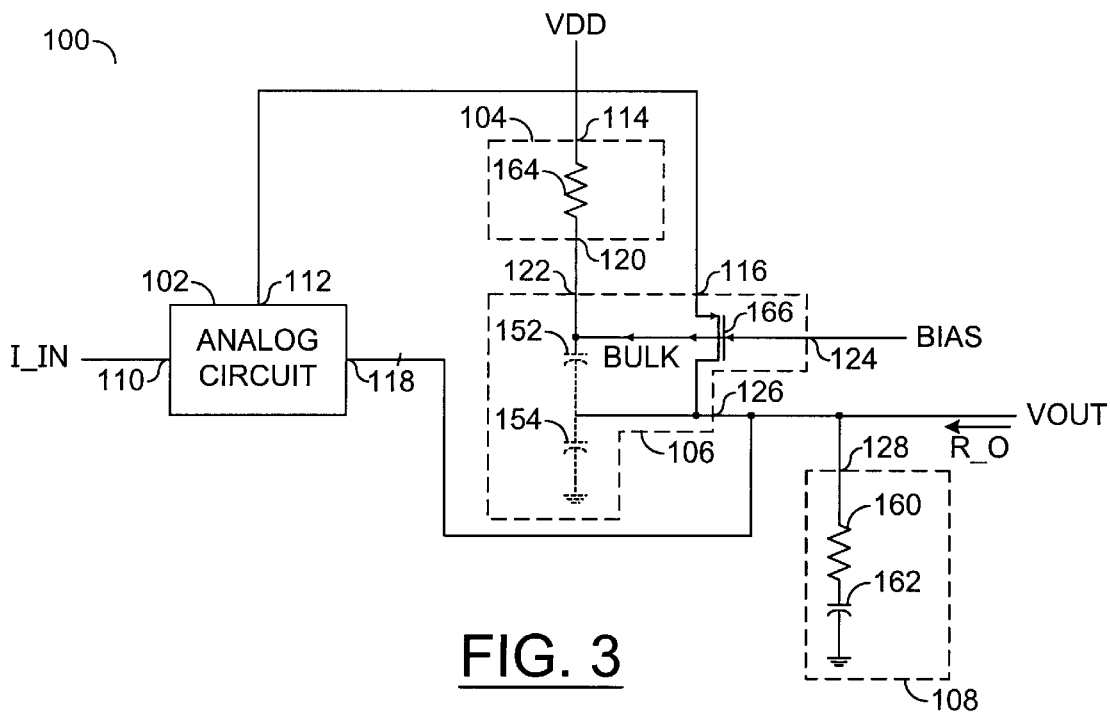
FIG. 3 is a schematic of a passive circuit, a load and parasitic circuit and a compensation circuit of FIG. 1.

Referring to FIG. 3, a detailed schematic of the passive block 104, the load and parasitic block 106 and the compensation block 108 is shown. In one example, the passive block 104 may comprise the resistor 164. However, the passive block 104 may comprise additional components in order to meet the criteria of a particular implementation. The first side of the resistor 164 may be connected to the voltage VDD (via input 114). The second side of the resistor 164 may be connected to a node (e.g., BULK) (via input/output 120 and input/output 122).

The load and parasitic block 106 may comprise a transistor 166, a parasitic capacitance 152 (from a drain of the transistor 166 to a well of the transistor 166) and a parasitic capacitance 154 (from the node VOUT to ground). The passive block 104 may be connected in series between the power source VDD and the parasitic capacitance 152. The parasitic capacitance 154 may be connected in series between the capacitance 152 and ground. The passive block 104, the capacitance 152 and the capacitance 154 may be coupled in a series configuration. The implementation of the passive block 104 may correct limitations from the drain to well capacitance 152.

In one example, the parasitic capacitance 152 may be implemented as a drain to well capacitance (e.g., approximately 3.75–4.25 pf, which may depend on the particular process). In another example, the parasitic capacitance 154 may be implemented as a total parasitic capacitance of the node VOUT to ground (e.g., approximately 8–12 pf, which may depend on the particular process). The input/output 122 (node VOUT) may be connected to the node BULK. The node BULK may be additionally coupled to a well (or bulk) of the transistor 166 and the capacitance 152.

The load and parasitic block 106 may receive the power source VDD at the input 116. The load and parasitic block 106 may receive the bias voltage BIAS at the input 124. The output 126 of the load and parasitic circuit 106 may be presented to the output node VOUT. The input/output 122 may be presented to the input/output 120 of the passive block 104.

The compensation block 108 may be connected to the output node VOUT, via the input/output 128. The compensation block 108 may comprise a resistor 160 and a capacitor 162. In one example, the resistor 160 may have a resistive value of 300 ohms. However, the resistor 160 may be implemented as other appropriate resistive values to meet the criteria of a particular implementation. A first side of the resistor 160 may be connected to the output node VOUT via the input/output 120. A second side of the resistor 160 may be connected to the capacitor 162. The capacitor 162 may additionally be coupled to ground.

In one example, the resistor 160 may be implemented as a compensation resistor and the capacitor 162 may be implemented as a compensation capacitor. However, the implementation of the resistor 160 and the capacitor 162 may be varied in order to meet the criteria of a particular implementation. The compensation block 108 may effect the signal/node VOUT. An output impedance (e.g., R_O) of the circuit 100 may effect (e.g., increase or decrease) the signal/node VOUT.

The circuit 100 may generate a pole at a particular frequency. The pole may be a value at which a magnitude of a transfer function (a measurement of an output of a circuit to an input of the circuit) equals infinity. The circuit 100 may shift the pole to a lower frequency in order to limit the gain to below one before a phase shift exceeds 360 degrees. The circuit 100 may limit the gain by implementing the compensation block 108. The compensation block 108 may prevent a next higher frequency pole from affecting the phase shift. The series configuration of the compensation block 108 may allow a zero to be placed at a same frequency as the next higher order pole, which may prevent the next higher pole from affecting the phase shift.

In one example, the load and parasitic block 106 may be implemented as an active load circuit. In another example, the load and parasitic block 106 may be implemented as a parasitic circuit. However, the load and parasitic block 106 may be implemented as any appropriate type load circuit, parasitic circuit and/or combination thereof in order to meet the criteria of a particular implementation. The transistor 166 may be implemented as any appropriate transistor in order to meet the criteria of a particular implementation. The transistor 166 may be implemented as, in one example, (i) a PMOS transistor, (ii) a NMOS transistor, (iii) a PNP transistor, or (iv) a NPN transistor either embedded in (a) a negative well or (b) a positive well.

A gate of the transistor 166 may be connected to the input 124. The gate of the transistor 166 may receive the bias voltage BIAS. A source of the transistor 166 may be connected to the input 116. The source may receive the voltage VDD. A drain of the transistor 166 may be connected to the output 126. The drain of the transistor 166 may be connected to the node VOUT. The well (or bulk) of the transistor 166 may be connected to the node BULK. The well (or bulk) of the transistor 166 may be connected to the input/output 122 and the capacitance 152. The capacitance 152 may be implemented as a bulk to substrate capacitance.

Figure 4:
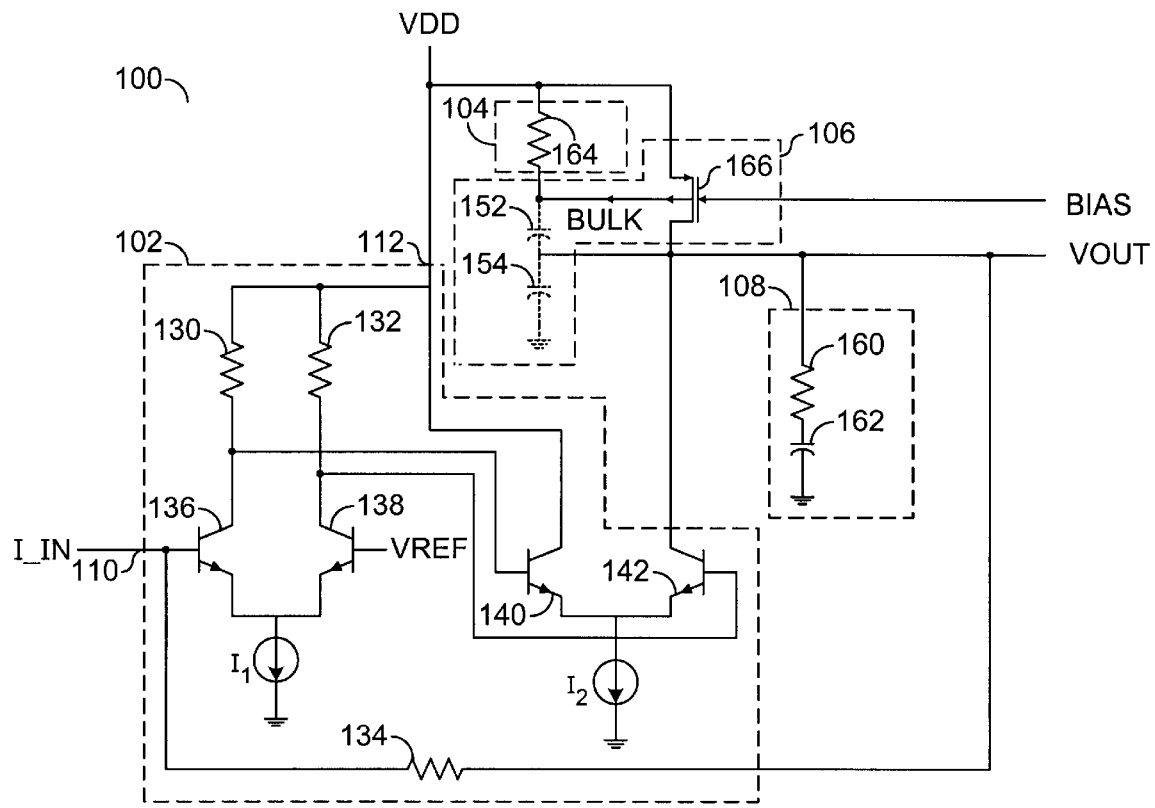
FIG. 4 is an overview schematic of the present invention.

Referring to FIG. 4, a detail schematic of the circuit 100 is shown. The circuit 100 may allow for a wider gain bandwidth. Additionally, the circuit 100 may allow for a greater phase margin. The circuit 100 may provide, in one example, a nearly two to one improvement in a gain bandwidth (GBW) for an unconditionally stable design.

The parasitic capacitance 152 may be a limiting effect of the load and parasitic block 106. The load and parasitic block 106 may negate the output resistance R_O of the circuit 100. Furthermore, the load and parasitic block 106 may generate a dominant pole that may be required to be shifted to a lower frequency. The dominant pole may be a value which occurs at a low enough frequency such that the dominant pole is the first effect felt on the transfer function, and may remain as the only effect on the transfer function for a predetermined frequency range. The passive block 104 may be implemented in series with the parasitic drain to well capacitance 152 to limit the phase shift effect of the parasitic capacitance 152. The circuit 100 may provide an increased GBW, since the passive block 104 is generally implemented in series with the parasitic capacitance 152.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an analog circuit configured to vary a voltage of an output signal having a pole at a first frequency in response to a first signal;
    a passive circuit configured to further vary said voltage;
    a first circuit comprising a parasitic capacitance, configured to further vary said voltage, wherein said passive circuit and said first circuit are coupled in series; and
    a second circuit coupled to said analog circuit, wherein said second circuit (i) comprises a first resistor and a second resistor coupled in series and (ii) is configured to generate a zero at a higher frequency pole.

2. The apparatus according to claim 1, wherein said first circuit comprises an active load circuit.

3. The apparatus according to claim 1, wherein said first circuit comprises a parasitic circuit.

4. The apparatus according to claim 1, wherein said second circuit is configured to further vary said voltage.

5. The apparatus according to claim 4, wherein said second circuit comprises a compensation circuit.

6. The apparatus according to claim 1, wherein said second circuit is configured to control said pole at said first frequency and said pole at said first frequency comprises a dominant pole.

7. The apparatus according to claim 1, wherein said first circuit is further configured to (i) lower said first frequency and/or (ii) generate said zero of said higher frequency pole.

8. The apparatus according to claim 7, wherein said first circuit comprises a second resistor coupled in series with a first parasitic capacitance and a second parasitic capacitance.

9. The apparatus according to claim 8, wherein (i) said second resistor and said first parasitic capacitance are configured to receive said voltage and (ii) said first and second parasitic capacitances are configured to vary said voltage, wherein said first parasitic capacitance is a drain to well parasitic capacitance, and said second parasitic capacitance is a bulk to substrate parasitic capacitance.

10. The apparatus according to claim 1, wherein said analog circuit comprises one or more elements selected from the group consisting of (i) a PMOS transistor, (ii) a NMOS transistor, (iii) a PNP transistor and (iv) a NPN transistor.

11. The apparatus according to claim 10, wherein each of said one or more elements is either (i) implemented in a positive well or (ii) implemented in a negative well.

12. An apparatus comprising:
    means for varying a voltage of an output signal having a pole at a first frequency in response to a first signal;
    means for further varying said voltage in further response to a parasitic capacitance;
    means for passively further varying said voltage; and
    means for generating a zero at a higher frequency pole comprising a resistor and a capacitor coupled in series.

13. A method for controlling an output voltage having a pole at a first frequency comprising the steps of:
    (A) varying said voltage in response to a first signal;
    (B) varying said voltage in further response to a parasitic capacitance;
    (C) varying said voltage passively; and
    (D) generating a zero close to a higher frequency pole with a circuit comprising a resistor and a capacitor coupled in series.

14. The method according to claim 13, wherein said circuit comprises a compensation circuit.

15. The method according to claim 13, wherein said step further comprises:
    (i) lowering said first frequency; and
    (ii) generating said zero that falls close to said higher frequency pole.

* * * * *